United States Patent
Krauska

(10) Patent No.: US 11,936,397 B2
(45) Date of Patent: Mar. 19, 2024

(54) MULTIPLE ANALOG-TO-DIGITAL CONVERTER SYSTEM TO PROVIDE SIMULTANEOUS WIDE FREQUENCY RANGE, HIGH BANDWIDTH, AND HIGH RESOLUTION

(71) Applicant: TEKTRONIX, INC., Beaverton, OR (US)

(72) Inventor: Alexander Krauska, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/863,304

(22) Filed: Jul. 12, 2022

(65) Prior Publication Data

US 2023/0020628 A1 Jan. 19, 2023

Related U.S. Application Data

(60) Provisional application No. 63/220,923, filed on Jul. 12, 2021.

(51) Int. Cl.
*H03M 1/10* (2006.01)
*G01R 13/02* (2006.01)
*G01R 23/16* (2006.01)

(52) U.S. Cl.
CPC ...... *H03M 1/1014* (2013.01); *G01R 13/0218* (2013.01); *G01R 23/16* (2013.01)

(58) Field of Classification Search
CPC ............. H03M 1/1014; H03M 1/0624; H03M 1/0626; H03M 1/121; G01R 13/0218; G01R 23/16

(Continued)

(56) References Cited

U.S. PATENT DOCUMENTS 6,084,539 A 7/2000 Yamada
10,483,996 B1 * 11/2019 Erdmann ................ H03M 1/10
(Continued)

FOREIGN PATENT DOCUMENTS

EP 3618283 4/2022
JP 10336487 12/1998
KR 20100031831 3/2010

OTHER PUBLICATIONS

Korean Intellectual Property Office, International Search Report and Written Opinion for International Application No. PCT/US2022/036864, dated Jan. 27, 2023, 12 pages, Daejeon, Republic of Korea.

*Primary Examiner* — Giovanni Astacio-Oquendo
(74) *Attorney, Agent, or Firm* — Miller Nash LLP; Andrew J. Harrington

(57) ABSTRACT

A composite analog-to-digital converter (ADC) has a low resolution ADC configured to receive and digitize analog data, the low resolution ADC having a low resolution and a high operating speed, one or more high resolution ADCs configured to receive and digitize the analog data, the one or more high resolution ADCs having a resolution higher than the low resolution ADC, and an operating speed lower than the high operating speed of the low resolution ADC, a sample clock generator to provide a sample clock signal to the low resolution ADC and to a clock divider, a mixer to receive the analog data and connected to the one or more high resolution ADCs, a local oscillator connected to the mixer to allow the one or more high resolution ADCs to be tuned to sample a portion of a spectrum of the first ADC. A test and measurement instrument contains a composite ADC. A method of operating a composite analog-to-digital converter (ADC), includes receiving an analog signal at a low resolution ADC that operates at a high speed, receiving the analog signal at one or more high resolution ADCs that operate at a resolution higher than the low resolution ADC (Continued)

and at a lower speed than the operating speed of the low resolution ADC, tuning the high resolution ADC to phase align and time align a signal path for the one or more high resolution ADCs to the signal path for the low resolution ADC, producing a spectrum from the low resolution ADC, and producing a portion of the spectrum from the one or more high resolution ADCs.

20 Claims, 5 Drawing Sheets

(58) Field of Classification Search
USPC .................................... 324/143, 76.11, 500
See application file for complete search history.

(56) References Cited

U.S. PATENT DOCUMENTS

| | | |
|---|---|---|
| 11,646,747 B1 * | 5/2023 | Lok ..................... H03M 1/0609 |
| | | 341/120 |
| 2005/0197068 A1 | 9/2005 | Gumm |
| 2010/0031831 A1 | 3/2010 | Jeon et al. |
| 2014/0111184 A1 | 4/2014 | Dalebroux |
| 2021/0226644 A1 * | 7/2021 | Kang .................. H03M 1/0626 |

* cited by examiner

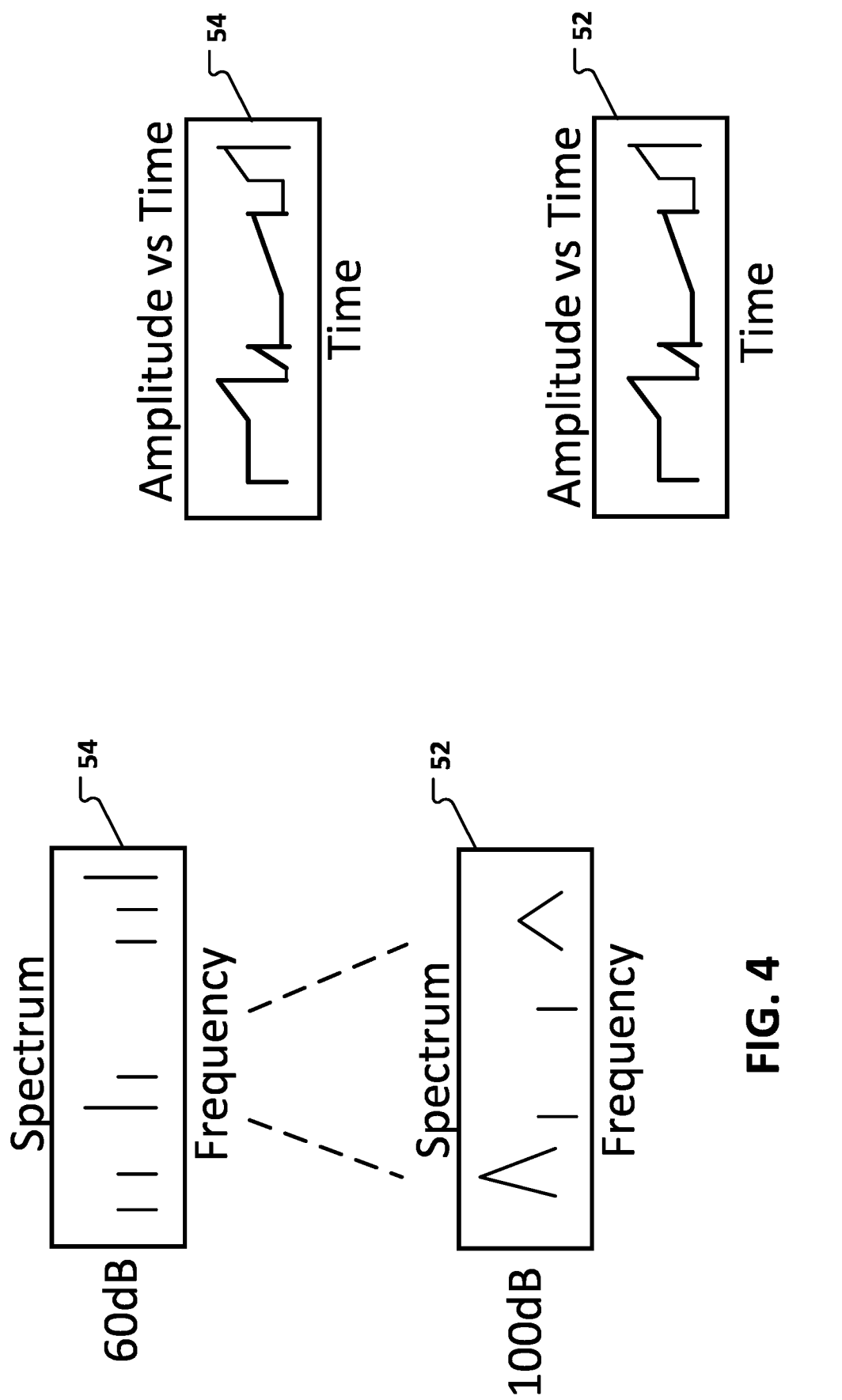

MULTIPLE ANALOG-TO-DIGITAL CONVERTER SYSTEM TO PROVIDE SIMULTANEOUS WIDE FREQUENCY RANGE, HIGH BANDWIDTH, AND HIGH RESOLUTION

CROSS-REFERENCE TO RELATED APPLICATIONS

This disclosure claims benefit of U.S. Provisional Application No. 63/220,923, titled "MULTIPLE ANALOG-TO-DIGITAL CONVERTER SYSTEM TO PROVIDE SIMULTANEOUS WIDE FREQUENCY RANGE, HIGH BANDWIDTH, AND HIGH RESOLUTION," filed on Jul. 12, 2021, the disclosure of which is incorporated herein by reference in its entirety.

TECHNICAL FIELD

This disclosure relates to test and measurement instruments, and more particularly to digitizing systems for use in a test and measurement instrument such as an oscilloscope.

BACKGROUND

Conventional test and measurement instruments use analog-to-digital converters (ADCs) to digitize waveforms received from devices under test (DUT). Generally, these use a high speed, relatively low resolution ADC. For example, a 10-bit ADC may sample at a clock rate of 100 Gigasamples per second (100 GS/s) each sample being 10 bits. The samples are delivered downstream for further processing.

A conventional ADC may consist of multiple sub-ADCs, such as 256 lower speed ADCs. Interleaving the outputs of these ADCs generates the 100 GS/s speed mentioned above. Combining multiple ADCs together results in spurious signals, also known as harmonics or interleaved spurious, and often called spurs. These interfere with the integrity of the signal and requires processing to remove or limit the noise as much as possible. However, some of the spurs vary over time and temperature making them hard to remove in further processing.

Using a lower speed ADC has advantages of lower spurs and high resolution, but has a lower sample rate.

BRIEF DESCRIPTION OF THE DRAWINGS

FIG. 4 shows a graphic representation of representative frequency displays from two of a group of analog-to-digital converters.

FIG. 5 shows a graphic representation of representative time displays from two of a group of analog-to-digital converters.

DESCRIPTION

The embodiments here disclose a multiple analog-to-digital converter (ADC) test and measurement instrument to provide simultaneous wideband width and high resolution at 40 dB improvement or more over a single ADC, based upon a relatively greater effective number of bits (ENOB) of the low speed ADC as compared to the high speed ADC. This is better than the current state of the art. The embodiments allow for automatic or guided removal of spurious signals, also referred to here as spurs, from high-speed ADCs typically in normal instrument operations or during instrument calibration. This improves the dynamic range and improves error vector magnitude uncertainty, used to measure the performance of an electronic component that transmits and/or receives signals.

The terms "high speed" and "low speed" as used here means the components operate at high or low speeds relative to each other. The discussion will refer to a high speed ADC, meaning that it operates at a higher speed than the other ADC. Similarly, the discussion referring to an ADC as "high resolution" and "low resolution" means that one has a bit depth higher than the other.

Figure 1:
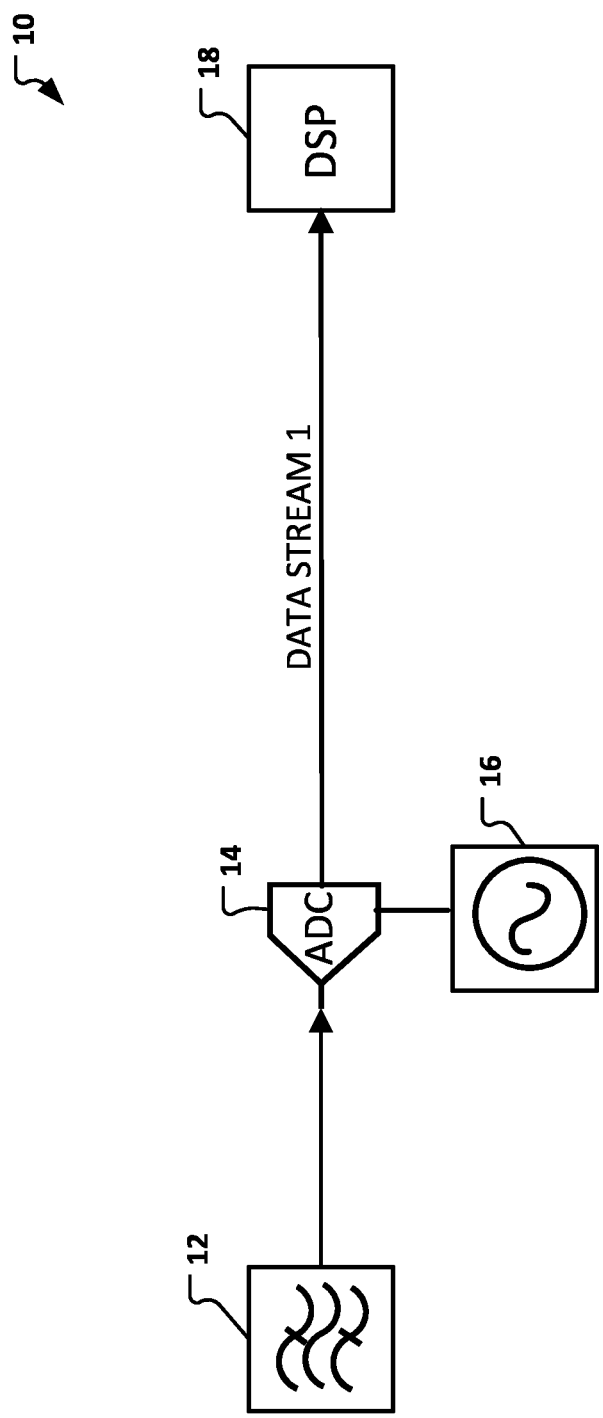
FIG. 1 shows a conventional ADC data stream in a test and measurement instrument.

FIG. 1 shows a conventional high speed ADC. The ADC 14 processes the analog waveform data from port 12. The port may connect to a device under test through a connector or probe to provide the analog waveform data to the high speed ADC. In an example, this may comprise a 10 bit ADC 14. The ADC samples the analog data at a clock rate offdock, provided typically by a sample clock generator such as 16. The ADC 14 may sample the waveform at 100 GigaSamples/sec (GS/s), and 10 bits, delivering the samples further downstream for processing, such as at processor 18. The resulting data stream may have several spurs that the processor may not be able to remove. This lowers the signal quality.

The term high speed, low resolution as used here refers to "one" ADC, including those embodiments of this ADC that comprises multiple ADCs that produce a combined, or interleaved, high speed, low resolution signal. The discussion below may address multiple low speed high resolution ADCs in an embodiment, the difference being that the multiple ADCs each produce their own signal separate from the other low speed high resolution ADCs.

Figure 2:
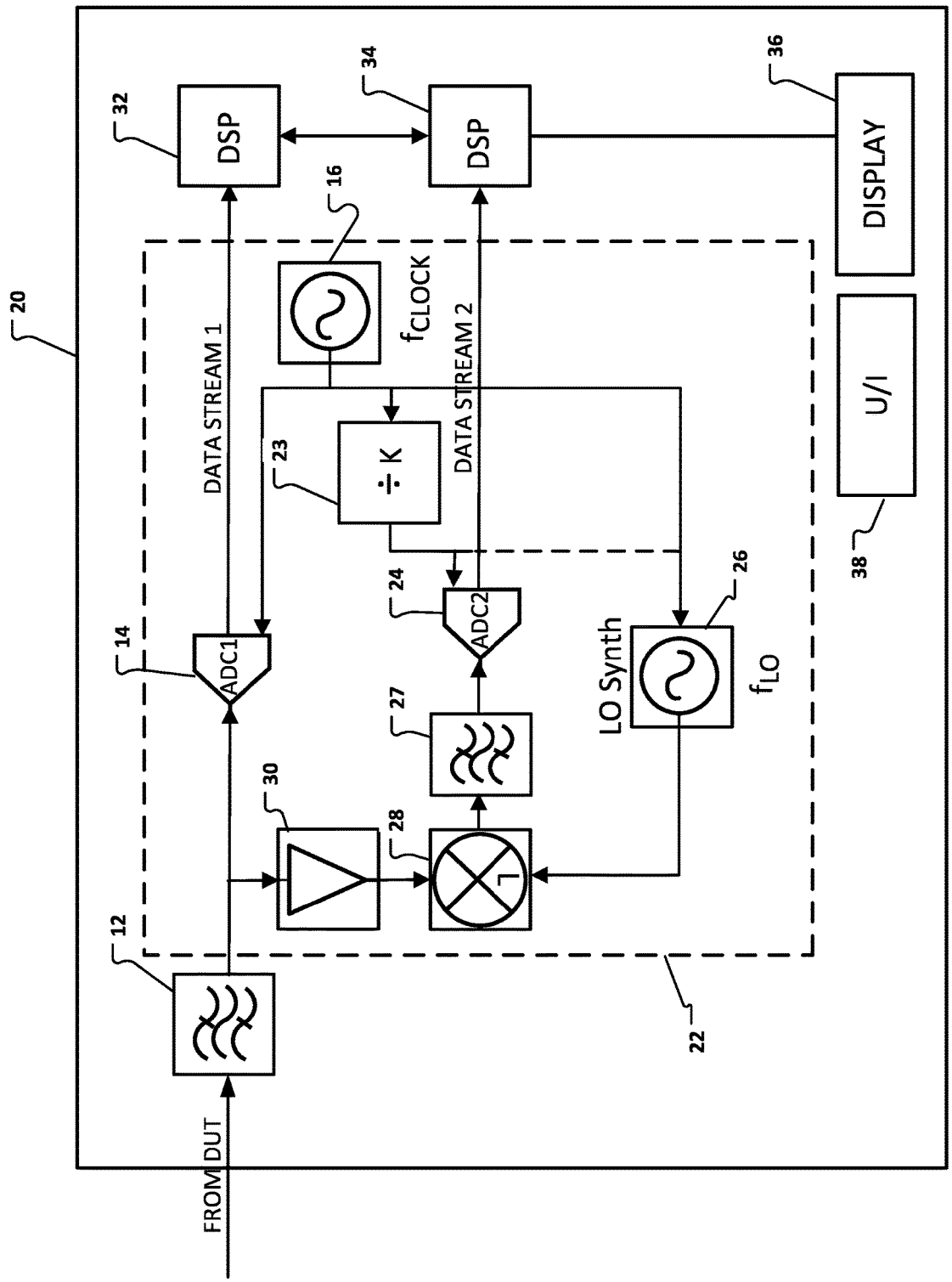
FIG. 2 shows a diagram of a test and measurement instrument having multiple analog-to-digital converters.

FIG. 2 shows a composite or hybrid ADC 22 in a test and measurement instrument 20. The instrument has two signal paths. The first signal path for DATASTREAM1 remains as in FIG. 1. The high speed, low resolution ADC1 14 receives the analog waveform data, generates samples at a high speed and low resolution using the sample clock 16. In the embodiments here, the composite ADC 22 has a second signal path DATASTREAM2. The analog waveform data enters a second signal path, typically in a second channel of the instrument 20. The second data path has a second ADC2 24 that operates with higher resolution but lower speed. Using the example from both just to demonstrate the differences, ADC2 24 may operate at 1 GS/s, with 16-bits of resolution.

Figure 3:
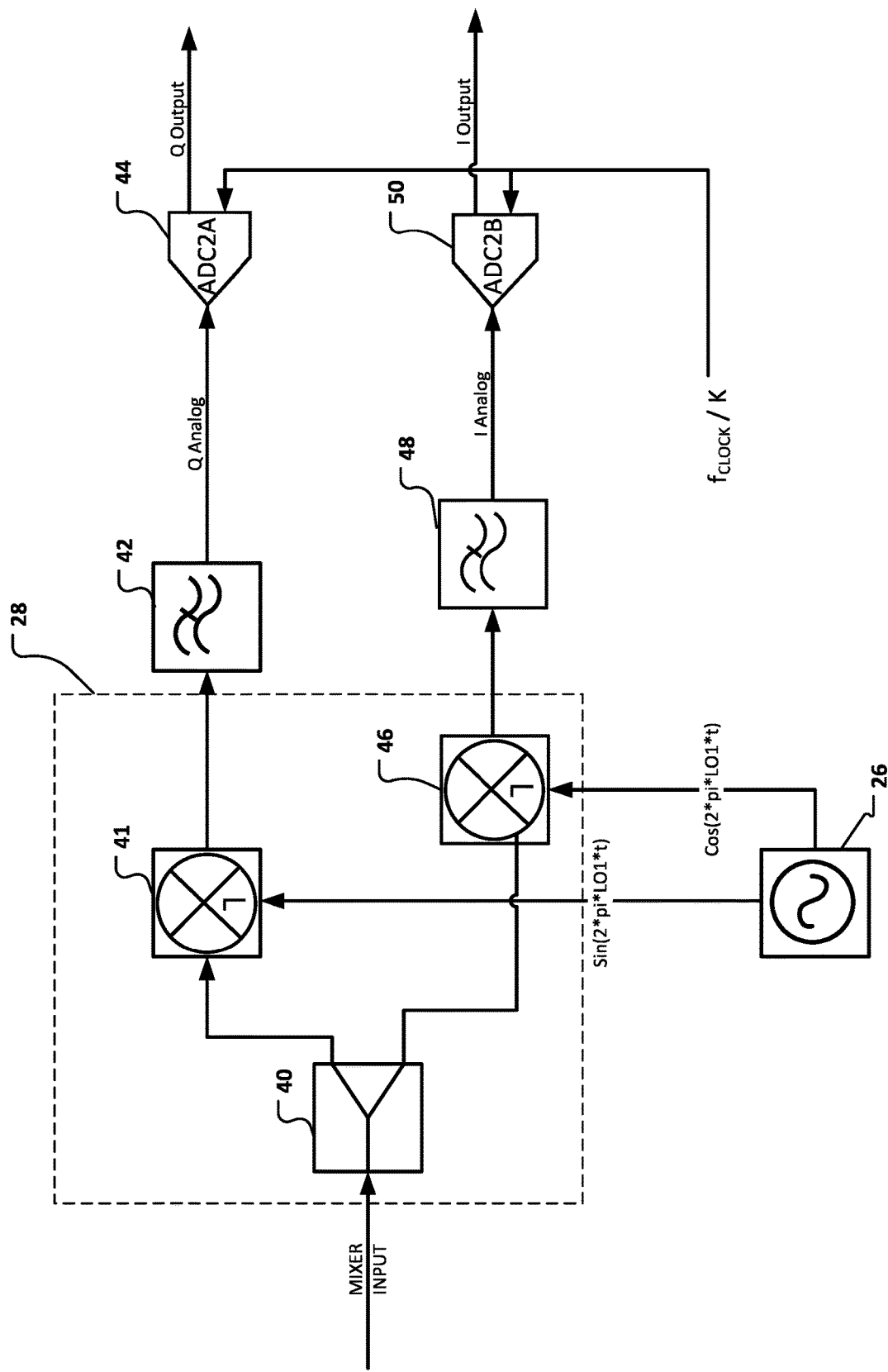
FIG. 3 shows an embodiment using two low speed, high resolution analog-to-digital converters.

The composite ADC shown in FIG. 2 overcomes the disadvantage of each ADC alone, and solves many of the problems of the lower speed high resolution ADC2 and the higher speed, low resolution ADC1. The ADC2 may comprise two or more copies of ADC2 and the mixer to expand the spurious correction in different portions of the spectrum of the low resolution ADC1. The mixer may be double sideband, single sideband or a direct conversion type where ADC2 is implemented with ADC2A and ADC2B, shown in FIG. 3. In the embodiment of FIG. 3, a direct conversion type uses one of several ways of producing an LO with quadrature cos and sin outputs. In the embodiment of FIG. 3, the mixer 28 comprises a splitter 40 and two mixers 41 and 46 that produce a quadrature output through mixer 41, filter 42 and ADC2A 44, using the LO1 26 output as sin(2*pi*LO1*t). The mixer 28 produces the in-phase output through mixer 46, filter 48 and ADC2B 50, using the LO1 26 output as cos(2*pi*LO1*t). The output of the direct conversion produces in-phase (I) and quadrature (Q) digital outputs of the ADC2A 44 and ADC2B 46. The direct conversion allows LO1 to be tuned exactly to the desired sampling frequency, whereas the double sideband and single sideband conversion required an offset frequency.

Returning to FIG. 2, the instrument 20 also includes a processor network comprised of one or more digital signal processors such as 32 and 34, as an example. The processor network may comprise other types and numbers of processors, including a general purpose or central processing unit. The processors may be embedded, or may comprise a field-programmable gate array (FPGA), graphics processing unit (GPU), or specialized digital signal processor (DSP), as examples. The one or more processors may be configured to execute code that will cause the processors to control the composite ADC. The instrument may also include a display 36 and a user interface 38.

The lower speed ADC2 will operate at a divided clock relative to the sample clock $f_{clock}$. In the above example, just to assist with understanding of the embodiments, the high speed ADC1 operates at 100 GS/s, and the low speed ADC2 operates at 1 GS/s, the clock divider 23 will divide the clock from oscillator 16 by a factor K of 100. This clock may also be provided to the local oscillator (LO Synth, or LO1) 26. Buffer 30 buffers the incoming signal before going into the mixer 28. The buffer isolates the mixer from the signal path between the waveform data and the high speed ADC1 14. It also prevents leakage from the mixer 28 and LO 26 from reaching the waveform input. The mixer 28 gets a synchronization signal from the local oscillator 26. The local oscillator 26 allows the spectrum of the low speed ADC 24 to be tuned to a portion of the spectrum from the high speed ADC 14.

Filter 27 may comprise s lowpass, bandpass, or highpass filter configured to match the selected Nyquist band used by the ADC 24. Typically, this filter will comprise a low pass filter. In one embodiment, the filter 27 comprises a tunable bandpass filter of a switched or varactor tuned architecture. The Nyquist band center frequency is given by $(f_{clock}/K)$ *0.25*J, where J=1, 3, 5, etc. (odd integers) for the desired Nyquist band. The Nyquist bandwidth is $(0.5*f_{clock})/K$ at full extent, but practically, smaller portions such as $0.32*(f_{clock}/K)$ are chosen.

FIG. 4 and FIG. 5 shows two representative time and frequency displays made possible by the composite ADC. Frequency displays may comprise things like a "spectrum," "spectrogram," and "ACPR" (Adjacent Channel Power Ratio) in FIG. 4. FIG. 5 shows time displays, such as amplitude versus time, phase versus time, or frequency versus time. The low resolution ADC produces a low resolution spectrum of just 60 dB at 54. This signal may also include the spurs previously mentioned that represent artifacts not present in the signal. The user interface 36 in FIG. 2 would allow the user to designate what portion of the wider spectrum they would like to zoom into view.

By tuning the local oscillator 26 of the mixer 28 in front of ADC2 24, from FIG. 2, one can tune to some portion of the spectrum 54, and show a simultaneous zoomed in spectrum at 52. As an example, assume the low resolution ADC1 captured a 40 GHz wide signal. The high resolution ADC2 may capture a 400 MHz wide signal at 100 dB. Further, the second ADC has a greater dynamic range, and may present signals without the spurs of the high resolution ADC. In another example, the ADC of the low resolution ADC could be 100 GS/s, and the high resolution ADC could be 5 GS/s with K=20, resulting in a divide by 20 synchronous clock divider.

Figure 6:
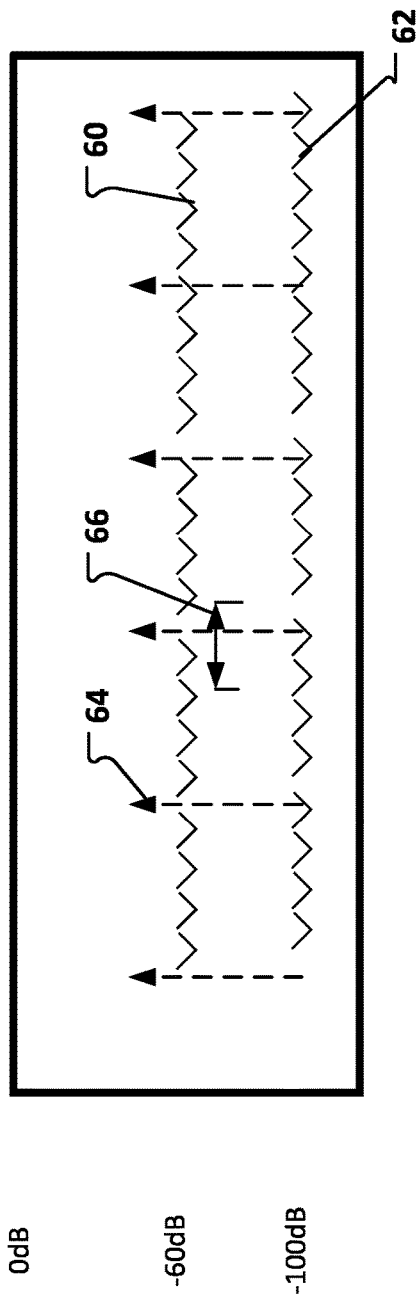
FIGS. 6 and 7 show a graphic representation of noise removal using a composite analog-to-digital-converter.
Figure 7:
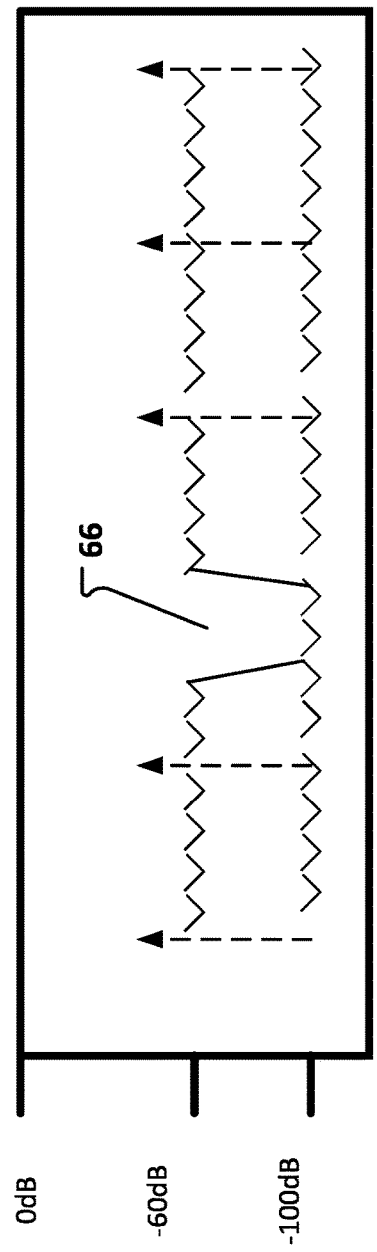

FIGS. 6-7 show a graphical representation of noise removal using a composite ADC such as discussed above. FIG. 6 shows the noise floor for the low speed, high resolution ADC2 at 60, which equals No_ADC2+ SFDR_ADC2, in dBFS (decibels relative to full scale). No_ADC2 refers to the broadband ADC noise term, and SFDR is the Spurious Free Dynamic Range. The SFDR for ADC2 in dB equals 6.02 ENOB_ADC2+1.76 dB. The noise floor 62 for the high speed, low resolution ADC1 is determined in the same manner, with the No_ADC1, SFDR and ENOB are the characteristic values for ADC1. The arrows such as 64 represent the spurious signals that result from the interleaving plus other spurious signals. The region or zone 66 in FIG. 6 represents the zone around a spurious signal that can be removed. As shown in FIG. 7, that spurious signal has been removed in the output of ADC2. This results in a 40 dB improvement in the frequency domain based on the bandwidth of ADC2, or ADC2A and ADC2B if those are used.

If the entire bandwidth signal processed in the DSP for ADC1 includes the smaller portion for ADC2, referring back FIG. 2, two DSP filters F1(s) and F2(s) can be constructed to do that. The filters have the relationships H(s)=F1'(s)+ F2(s). F1(s) is the correct response of ADC1 to be as frequency flat as possible when calibrated. F2(s) is the corrected response for the ADC2 (or ADC2A+ADC2B), over the selected bandwidth. F1'(s) is the computed notch in the response of F1(s) with which F2(s) allows the above relationship can be met. This response is a bandpass diplexor, computed by real synthesis technique or by Fourier term extraction. F1(s), and F1'(s) are computed on the serial stream of complex data/real data from ADC1. F2(s) is computed on the data stream of ADC2/ADC2A+ADC2B, filtered and upsampled to match the same rate of the data stream of ADC1. The ADC1 stream may be the full sample rate of ADC1, up or downsampled using well-known re-sampling methods. Alternatively, the narrow bandwidth of ADC2 can be viewed and/or processed concurrently with ADC1.

The composite ADC comprised of the two ADCs would nominally have a dynamic range at the same clipping levels. The gains present in the mixer 28 would be aligned, as would the reference voltage of the low speed ADC. The user benefits from getting a high resolution zoom-in of any spectral data located with the measurement of the low resolution ADC, simply by tuning the second ADC using LO 26 into the desired frequency position. This allows the user to scan wide-bandwidth, analyze deeply and narrow operation simultaneously, and available in two simultaneous, time aligned signal paths.

One should note that the above discussion focused on one high resolution, low speed ADC and a corresponding mixer, the system may include multiple ADCs to operate on different bands at the same time.

The presence of the one or more processors in the instrument 20 allows for calibration of ADC1 by ADC2 when an input signal occurs within the frequency range of both. This allows for real time calibration of ADC1 by ADC2 in the presence of either a user input signal, or an internal instrument reference signal, either automatically during normal use, or intentional factory calibration with laboratory signals. A spur present in ADC1, for example, would not be present for ADC2. The one or more processors may use this information from ADC2 to remove the offending spurs.

As the one or more processors execute code from the software/firmware, they may determine the presence of a signal in the dynamic range of ADC1. The one or more processors could then determine the signal's frequency automatically, such as by Fourier or similar techniques in the first DSP 32. The processor could then tune the LO 26 in front of ADC2 to center ADC2 in the center of the identified signal. Measurements in the ADC2 path could confirm signals measured in the ADC1 path. The processor could flag signals not present in the ADC2 path and within the expected bandwidth as spurious, and removed from the ADC1 signal.

The calibration operations above could involve guidance from a laboratory signal generator or an arbitrary waveform generator (AWG) to provide input to ADC1 and ADC2. The signal source and LO1 would sweep the entire band step by step. The one or more processors would then catalog the undesired signal levels, frequency and phase in the ADC1. Saving these results as a calibration file would allow DSP1 to remove spurious signals.

In the architecture shown in FIG. 2, each ADC has a dedicated, or corresponding, processor. This provides one possible implementation. For example, the information obtained from performing measurements in the signal path of ADC2 by DSP2 would then allow DSP1 to make corrections. ADC2 may comprise multiple low speed high resolution ADCs, and each may have their own dedicated processors. The following discussion would apply to the additional processors.

The two processors, in this embodiment DSP1 and DSP2, would have their operations cross-connected, allowing performance of cross correlation and other measurements for calibration, noise reduction or spurious reduction at composite frequencies. Because the two ADCs share the same input signal, cross correlation can resolve any time offset of each signal path. Within the DSP sections, oversampling, also known as interpolation, can be performed to precisely phase align operations of the two signal paths. The local oscillator LO1 will have a phase-locked loop (PLL) that receives a clock signal. That clock signal may be directly the clock from ADC1, the clock from ADC2 or a divided down or multiplied version of either.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, substrate integrated waveguide (SIW), a glass/quartz substrate waveguide, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a composite analog-to-digital converter (ADC), comprising: a low resolution ADC configured to receive and digitize analog data, the low resolution ADC having a low resolution and a high operating speed; one or more high resolution ADCs configured to receive and digitize the analog data, the one or more high resolution ADCs having a resolution higher than the low resolution ADC, and an operating speed lower than the high operating speed of the low resolution ADC; a sample clock generator to provide a sample clock signal to the low resolution ADC and to a clock divider; a mixer to receive the analog data and connected to at least one of the one or more high resolution ADCs; and a local oscillator connected to the mixer to allow at least one of the one or more high resolution ADCs to be tuned to sample a portion of a spectrum of the first ADC.

Example 2 is the composite ADC of Example 1, wherein the one or more high resolution ADCs receive a clock signal from the clock divider.

Example 3 is the composite ADC of either of Examples 1 or 2, further comprising a buffer between the analog data and the mixer to isolate the mixer from a signal path between the analog data and the low resolution ADC.

Example 4 is the composite ADC of any of Examples 1 through 3, wherein the low resolution ADC comprises multiple ADCs having operating speeds lower than the high operating speed, the multiple ADCs to produce a combined output signal at the high operating speed.

Example 5 is the composite ADC of any of Examples 1 through 4, wherein the one or more high resolution ADCs comprises multiple high resolution ADCs, each tuned to a different portion of a spectrum of the low resolution ADC.

Example 6 is a test and measurement instrument, comprising: a port to receive analog data from a device under test; a composite analog-to-digital converter (ADC), comprising: a low resolution ADC configured to receive and digitize the analog data at a low resolution and a high operating speed; one or more high resolution ADCs configured to receive and digitize the analog data at a high resolution higher than the low resolution of the low resolution ADC and a lower operating speed lower than the high operating speed of the low resolution ADC; a sample clock generator to provide a sample clock signal to the low resolution ADC; a mixer connected between the port and the one or more high resolution ADCs; a local oscillator connected to the mixer to allow the one or more high resolution ADCs to be tuned to sample a portion of a spectrum of the low resolution ADC; and one or more processors configured to execute code to cause the one or more processors to: tune the local oscillator to a portion of a spectrum of the low resolution ADC; and display at least one of the spectrum of the low resolution ADC and the portion of the spectrum.

Example 7 is the test and measurement instrument of Example 6, wherein the code to cause the one or more processors to tune the local oscillator to the portion of the spectrum comprises code to cause the one or more processors to tune the local oscillator to a desired frequency position in the spectrum of the low resolution ADC.

Example 8 is the test and measurement instrument of either of Examples 6 or 7, wherein the one or more processors are further configured to execute code to cause the one or more processors to calibrate the low resolution ADC using the high resolution ADC in the presence of a signal either resulting from a user input or an internal instrument signal.

Example 9 is the test and measurement instrument of Example 8, wherein the code to cause the one or more processors to calibrate the low resolution ADC using data from the high resolution ADC further causes the one or more processors to remove one or more spurs present in the low resolution ADC when the one or more spurs are not present in the high resolution ADC.

Example 10 is the test and measurement instrument of Example 9, wherein the code to cause the one or more processors to remove one or more spurs present in the low resolution ADC further comprises code to cause the one or more processors to: measure the signal in a path of the high resolution ADC; measure the signal in a path of the low resolution ADC; determine spurious signals in the path of the low resolution ADC that are not present in the path of the high resolution ADC; and flag the spurious signals to be removed from the path of the low resolution ADC.

Example 11 is the test and measurement instrument of any of Examples 8 through 10, wherein the processors are further configured to execute code to cause the one or more processors to: sweep an entire band of the low resolution ADC; flag the spurious signals; and store the flags as a calibration file for future use to remove spurious signals during operation of the low resolution ADC.

Example 12 is the test and measurement system of any of Examples 8 through 11, wherein the calibration occurs during one of normal operation or during factory calibration.

Example 13 is the test and measurement instrument of any of Examples 6 through 12, wherein the code to cause the one or more processors to tune the local oscillator to a portion of a spectrum of the low resolution ADC comprises: detecting a signal is present in a dynamic range of the low resolution ADC; determining a frequency of the signal; and tuning the high resolution ADC to center the high resolution ADC in a center of the signal.

Example 14 is the test and measurement instrument of any of Examples 6 through 13, wherein the one or more processors comprises a processor dedicated to the low resolution ADC, and a processor dedicated to each of the one or more high resolution ADCs, and the processor for the low resolution ADC and each of the processors dedicated to the one or more high resolution ADCs are cross connected.

Example 15 is the test and measurement system of Example 14, wherein the cross connected processors are configured to execute code to cause the cross connected processors to resolve any time offset between a signal path low resolution ADC and the a signal path of the high resolution ADC to phase align the signal paths.

Example 16 is the test and measurement system of any of Examples 6 through 15, wherein the one or more processors are further configured to execute code to display the spectrum of the low resolution ADC and to display the portion of the spectrum of the high resolution ADC simultaneously.

Example 17 is the test and measurement system of Example 16, wherein the portion of the spectrum of the high resolution ADC being displayed is determined by a user input relative to the spectrum of the low resolution ADC.

Example 18 is the method of operating a composite analog-to-digital converter (ADC), comprising: receiving an analog signal at a low resolution ADC that operates at a high speed; receiving the analog signal at one or more high resolution ADCs that operate at a resolution higher than the low resolution ADC and at a lower speed than the operating speed of the low resolution ADC; tuning the high resolution ADC to phase align and time align a signal path for the one or more high resolution ADCs to the signal path for the low resolution ADC; and producing a spectrum from the low resolution ADC; and producing a portion of the spectrum from the one or more high resolution ADCs.

Example 19 is the method of Example 18, further comprising using information from the one or more high resolution ADCs to calibrate the low resolution ADC including removing spurs.

Example 20 is the method of either of Examples 18 or 19, further comprising determining a frequency of the spectrum of the low resolution ADC and tuning the one or more high resolution ADCs to a center of the spectrum.

Although specific aspects of the disclosure have been illustrated and described for purposes of illustration, it will be understood that various modifications may be made without departing from the spirit and scope of the disclosure. Accordingly, the disclosure should not be limited except as by the appended claims.

I claim:

1. A composite analog-to-digital converter (ADC), comprising:
   a low resolution ADC configured to receive and digitize analog data, the low resolution ADC having a low resolution and a high operating speed;
   one or more high resolution ADCs configured to receive and digitize the analog data, the one or more high resolution ADCs having a resolution higher than the low resolution ADC, and an operating speed lower than the high operating speed of the low resolution ADC;
   a sample clock generator to provide a sample clock signal to the low resolution ADC and to a clock divider;
   a mixer to receive the analog data and connected to at least one of the one or more high resolution ADCs; and
   a local oscillator connected to the mixer to allow at least one of the one or more high resolution ADCs to be tuned to sample a portion of a spectrum of the low resolution ADC.

2. The composite ADC as claimed in claim 1, wherein the one or more high resolution ADCs receive a clock signal from the clock divider.

3. The composite ADC as claimed in claim 1, further comprising a buffer between the analog data and the mixer to isolate the mixer from a signal path between the analog data and the low resolution ADC.

4. The composite ADC as claimed in claim 1, wherein the low resolution ADC comprises multiple ADCs having operating speeds lower than the high operating speed, the multiple ADCs to produce a combined output signal at the high operating speed.

5. The composite ADC as claimed in claim 1, wherein the one or more high resolution ADCs comprises multiple high resolution ADCs, each tuned to a different portion of a spectrum of the low resolution ADC.

6. A test and measurement instrument, comprising:
   a port to receive analog data from a device under test;
   a composite analog-to-digital converter (ADC), comprising
   a low resolution ADC configured to receive and digitize the analog data at a low resolution and a high operating speed;
   one or more high resolution ADCs configured to receive and digitize the analog data at a high resolution higher than the low resolution of the low resolution ADC and a lower operating speed lower than the high operating speed of the low resolution ADC;
   a sample clock generator to provide a sample clock signal to the low resolution ADC;
   a mixer connected between the port and the one or more high resolution ADCs ADC;
   a local oscillator connected to the mixer to allow the one or more high resolution ADCs to be tuned to sample a portion of a spectrum of the low resolution ADC; and
   one or more processors configured to execute code to cause the one or more processors to:
   tune the local oscillator to a portion of a spectrum of the low resolution ADC; and
   display at least one of the spectrum of the low resolution ADC and the portion of the spectrum.

7. The test and measurement instrument as claimed in claim 6, wherein the code to cause the one or more processors to tune the local oscillator to the portion of the spectrum comprises code to cause the one or more processors to tune the local oscillator to a desired frequency position in the spectrum of the low resolution ADC.

8. The test and measurement instrument as claimed in claim 6, wherein the one or more processors are further configured to execute code to cause the one or more processors to calibrate the low resolution ADC using the high resolution ADC in the presence of a signal either resulting from a user input or an internal instrument signal.

9. The test and measurement instrument as claimed in claim 8, wherein the code to cause the one or more processors to calibrate the low resolution ADC using data from the high resolution ADC further causes the one or more processors to remove one or more spurs present in the low resolution ADC when the one or more spurs are not present in the high resolution ADC.

10. The test and measurement instrument as claimed in claim 9, wherein the code to cause the one or more processors to remove one or more spurs present in the low resolution ADC further comprises code to cause the one or more processors to:
    measure the signal in a path of the high resolution ADC;
    measure the signal in a path of the low resolution ADC;
    determine spurious signals in the path of the low resolution ADC that are not present in the path of the high resolution ADC; and
    flag the spurious signals to be removed from the path of the low resolution ADC.

11. The test and measurement instrument as claimed in claim 8, wherein the processors are further configured to execute code to cause the one or more processors to:
    sweep an entire band of the low resolution ADC;
    flag the spurious signals; and
    store the flags as a calibration file for future use to remove spurious signals during operation of the low resolution ADC.

12. The test and measurement system as claimed in claim 8, wherein the calibration occurs during one of normal operation or during factory calibration.

13. The test and measurement instrument as claimed in claim 6, wherein the code to cause the one or more processors to tune the local oscillator to a portion of a spectrum of the low resolution ADC comprises code to cause the one or more processors to:
    detect a signal is present in a dynamic range of the low resolution ADC;
    determine a frequency of the signal; and
    tune the high resolution ADC to center the high resolution ADC in a center of the signal.

14. The test and measurement instrument as claimed in claim 6, wherein the one or more processors comprises a processor dedicated to the low resolution ADC, and a processor dedicated to each of the one or more high resolution ADCs, and the processor for the low resolution ADC and each of the processors dedicated to the one or more high resolution ADCs are cross connected.

15. The test and measurement system as claimed in claim 14, wherein the cross connected processors are configured to execute code to cause the cross connected processors to resolve any time offset between a signal path of the low resolution ADC and a signal path of the high resolution ADC to phase align the signal paths.

16. The test and measurement system as claimed in claim 6, wherein the one or more processors are further configured to execute code to display the spectrum of the low resolution ADC and to display the portion of the spectrum of the high resolution ADC simultaneously.

17. The test and measurement system as claimed in claim 16, wherein the portion of the spectrum of the high resolution ADC being displayed is determined by a user input relative to the spectrum of the low resolution ADC.

18. A method of operating a composite analog-to-digital converter (ADC), comprising:
receiving an analog signal at a low resolution ADC that operates at a high speed;
receiving the analog signal at one or more high resolution ADCs that operate at a resolution higher than the low resolution ADC and at a lower speed than the operating speed of the low resolution ADC;
tuning the high resolution ADC to phase align and time align a signal path for the one or more high resolution ADCs to the signal path for the low resolution ADC; and
producing a spectrum from the low resolution ADC; and
producing a portion of the spectrum from the one or more high resolution ADCs.

19. The method as claimed in claim 18, further comprising using information from the one or more high resolution ADCs to calibrate the low resolution ADC including removing spurs.

20. The method as claimed in claim 18, further comprising determining a frequency of the spectrum of the low resolution ADC and tuning the one or more high resolution ADCs to a center of the spectrum.

* * * * *